United States Patent
Schaefer et al.

(10) Patent No.: US 10,273,576 B2
(45) Date of Patent: Apr. 30, 2019

(54) GLOSS DEGREE ADJUSTMENT OF PLASTICS SUBSTRATES HAVING A METALLIC FINISH

(71) Applicant: Oerlikon Surface Solutions AG, Pfäffikon, Pfäffikon (CH)

(72) Inventors: Rüdiger Schaefer, Grafenhausen (DE); Marc Rosezin, Sigmaringen (DE); Johannes Wehrle, Krauchenwies (DE)

(73) Assignee: Oerlikon Surface Solutions AG, Pfaffikon, Pfaffikon (CH)

( * ) Notice: Subject to any disclaimer, the term of this patent is extended or adjusted under 35 U.S.C. 154(b) by 520 days.

(21) Appl. No.: 14/890,324

(22) PCT Filed: Apr. 24, 2014

(86) PCT No.: PCT/EP2014/001092
§ 371 (c)(1),
(2) Date: Nov. 10, 2015

(87) PCT Pub. No.: WO2014/180537
PCT Pub. Date: Nov. 13, 2014

(65) Prior Publication Data
US 2016/0108520 A1   Apr. 21, 2016

(30) Foreign Application Priority Data

May 10, 2013 (DE) ................. 10 2013 007 926

(51) Int. Cl.
| | |
|---|---|
| *C23C 16/14* | (2006.01) |
| *C23C 16/44* | (2006.01) |
| *C09D 5/28* | (2006.01) |
| *C09D 5/29* | (2006.01) |
| *C23C 14/22* | (2006.01) |
| *C23C 14/35* | (2006.01) |
| *C25D 5/54* | (2006.01) |
| *C25D 7/00* | (2006.01) |

(52) U.S. Cl.
CPC ............... *C23C 16/44* (2013.01); *C09D 5/28* (2013.01); *C09D 5/29* (2013.01); *C23C 14/22* (2013.01); *C23C 14/35* (2013.01); *C25D 5/54* (2013.01); *C25D 7/00* (2013.01)

(58) Field of Classification Search
CPC combination set(s) only.
See application file for complete search history.

(56) References Cited

U.S. PATENT DOCUMENTS

| | | |
|---|---|---|
| 7,132,130 B1 | 11/2006 | Kloss |
| 2009/0211913 A1 | 8/2009 | Franz |

FOREIGN PATENT DOCUMENTS

| | | |
|---|---|---|
| DE | 10303650 A1 | 7/2004 |
| DE | 102011115342 A1 | 4/2013 |
| DE | 202013010250 U1 | 1/2014 |
| EP | 1736566 A1 | 12/2006 |
| EP | 1736566 B1 | 12/2006 |
| EP | 1780311 A1 | 5/2007 |
| EP | 2093267 * | 8/2008 |
| EP | 2093267 A2 | 8/2009 |
| EP | 1736566 * | 12/2009 |
| EP | 2537406 A1 | 12/2012 |
| JP | S575870 A | 1/1982 |
| JP | 2001270393 A | 10/2001 |
| JP | 2008248084 A | 10/2008 |

* cited by examiner

*Primary Examiner* — Monique R Peets

(57) ABSTRACT

A method for producing a component with a predetermined gloss level, including the steps of: preparing a component with a metallic surface; producing a matte/glossy mixture by mixing glossy paint and matte paint in a predetermined mixing ratio; applying the matte/glossy mixture to the metallic surface of the component; and cross-linking the matte/glossy mixture.

7 Claims, No Drawings

GLOSS DEGREE ADJUSTMENT OF PLASTICS SUBSTRATES HAVING A METALLIC FINISH

FIELD OF THE INVENTION

The present invention relates to a method for gloss level adjustment of plastic substrates having a metallic finish.

BACKGROUND OF THE INVENTION

Plastic substrates are used, for example, in the automotive sector as trim strips, radiator grilles, outside rear view mirrors, or emblems on the exterior of a motor vehicle. In motor vehicle interiors, entirely metallic components are being increasingly replaced by plastic components that have a coating that gives them a metallic appearance.

The known and typical coating methods include electroplating. But this involves a significant strain on the environment so that considerable efforts are being made to replace the electroplating process with other methods.

A somewhat newer approach lies in first coating the plastic substrates with a basecoat and then covering this with a metal layer that is deposited from the gas phase. A corresponding method is described in EP 1 736 566. In this case, a UV-hardening polymer layer is applied to a substrate, which is then coated by means of physical deposition from the gas phase, for example with a chromium or chromium-like layer that constitutes the outermost layer.

This method, however, has the disadvantage that the outermost layer is a PVD layer that is very thin and—since it is deposited onto a soft undercoat—is very susceptible to mechanical influences. This type of coating is not suitable for the use of such coated components on the exterior of a motor vehicle that is exposed to stone chipping and a wide variety of weather conditions.

In addition, automobile manufacturers not only require this type of component to have a metallic appearance, they also require a particular gloss level.

The object of the invention, therefore, is to disclose a method with which a component is given a metallic appearance with the required gloss level.

SUMMARY OF THE INVENTION

According to the invention, the object is attained in that the metallic surface, however it is produced, is provided with a UV-hardened paint coat; the paint used for producing the paint coat is a mixture that contains at least one first part of UV-hardened glossy paint and a second part of UV-hardened matte paint. The gloss level to be produced predetermines the mixture ratio between the glossy paint and matte paint.

Such UV-hardened glossy paints and UV-hardened matte paints are known and are sold, for example, by the company Marabu GmbH & Co. KG as UVLG and UVLM paints.

The invention will be explained by way of example and in detail below in conjunction with an exemplary embodiment.

DETAILED DESCRIPTION OF THE PREFERRED EMBODIMENTS

According to a first embodiment of the present invention, a plastic substrate that is to serve as the front covering of an outside rear view mirror and is to be provided with a slightly matte chrome-plated appearance is first cleaned in an ultrasonic bath and then dried, for example with the aid of an infrared heat lamp. For example, PC/ABS can be used as the plastic material, Then a 20 µm thick UV-hardened paint coat is applied as a basecoat to at least part of the surface of the plastic substrate. It is irrelevant here whether the UV-hardened paint is a glossy paint or a matte paint. The solvents escape from the paint coat and the polymers in the paint are cross-linked by means of UV radiation. This basecoat is essentially provided to smooth out any roughness on the surface of the original plastic substrate.

After cross-linking is completed, the surface is coated with a PVD layer. In the example, the plastic substrate is transferred to a magnetron sputtering unit that is operated with at least one chromium target. If the sputtering unit also has Zr and/or Al targets, then the chromium layer to be produced can be provided with different desired color nuances through the addition of small concentrations of Zr and/or Al. In the example, the PVD layer, which is essentially composed of chromium, is deposited to a thickness of <1.5 µm.

The intermediate result is a plastic substrate, which, thanks to the <1.5 µm thick layer of chromium, has a glossy metallic chromium surface, but is unprotected.

According to the embodiment of the present invention described here, UV-hardened glossy paint is mixed with UV-hardened matte paint in a 50%:50% ratio. The paint mixed in this way is applied to the chromium layer of the plastic substrate as a layer 20 µm thick. The solvent is permitted to escape, for example assisted with IR radiation, and the polymers of the mixed paint are cross-linked by means of UV radiation. This produces a plastic substrate that has a surface that is in fact metallic, but has a slightly matte surface due to the mixed paint. The mixing ratio of glossy paint to matte paint can be adjusted depending on whether the customer wishes a higher or lower gloss level for the resulting component.

Preferably, a matrix is formed of different patterns produced by means of the above-described method, with the patterns having different color nuances in the columns of the matrix and the patterns having different gloss levels in the rows of the matrix. This matrix can, for example, be produced in a sample case so that it is possible to directly compare the different color nuances and gloss levels.

The invention has been described in the context of a PVD layer that has been applied to the plastic substrate. It is also possible, however, to give almost any metallic and/or glossy surface a desired gloss level through a corresponding mixture of the UV-hardened paint (glossy paint and matte paint).

A method has been disclosed for producing a component with a predetermined gloss level, including the steps:
  preparing a component with a metallic surface
  producing a matte/glossy mixture by mixing glossy paint and matte paint in a predetermined mixing ratio
  applying the matte/glossy mixture to the metallic surface of the component
  cross-linking the matte/glossy mixture.

The glossy paint and/or matte paint can be a UV-hardened paint and the cross-linking of the matte/glossy mixture can be produced by means of UV radiation. To provide the component, a plastic substrate can be coated with a layer system that has at least one metallic layer. The coating can be applied by means of a PVD and/or CVD method and/or by means of electroplating. A paint coat, preferably a UV-hardened paint coat, can be applied between the layer system and the plastic substrate. The layer system can include at least two metallic layers. The layer system can have two or more metallic elements in elemental form, in the form of an alloy, and/or in the form of a compound.

A component with a predetermined gloss level has been disclosed in which a layer composed of a cross-linked mixture of glossy paint and matte paint is applied to a metallic surface. The component can include a plastic substrate with a layer system that has at least one metallic layer. A paint coat can be provided between the layer system and the plastic substrate. At least one of the paints and preferably all of the paints can be UV-hardened paints.

The invention claimed is:

1. A method for producing a component with a predetermined gloss level, comprising the steps of:
    preparing a component with a metallic surface;
    producing a matte/glossy mixture by mixing glossy paint and matte paint in a predetermined mixing ratio;
    applying the matte/glossy mixture to the metallic surface of the component; and
    cross-linking the matte/glossy mixture.

2. The method according to claim 1, wherein the glossy paint and/or matte paint is a UV-hardened paint and the cross-linking of the matte/glossy mixture is achieved by UV radiation.

3. The method according to claim 1, further comprising preparing the component by coating a plastic substrate with a layer system that has at least one metallic layer.

4. The method according to claim 3, comprising applying the coating using a PVD and/or CVD method and/or by electroplating.

5. The method according to claim 3, comprising applying a UV-hardened paint coat between the layer system and the plastic substrate.

6. The method according to claim 3, wherein the layer system has at least two metallic layers.

7. the method according to claim 3, wherein the layer system has at least two or more metallic elements in elemental form, in the form of an alloy, and/or in the form of a compound.

* * * * *